United States Patent
Link et al.

(10) Patent No.: US 9,160,306 B2
(45) Date of Patent: Oct. 13, 2015

(54) DUPLEXER AND METHOD FOR INCREASING THE ISOLATION BETWEEN TWO FILTERS

(75) Inventors: Andreas Link, Munich (DE); Bernhard Bader, Neubiberg (DE)

(73) Assignee: EPCOS AG, Munich (DE)

( * ) Notice: Subject to any disclaimer, the term of this patent is extended or adjusted under 35 U.S.C. 154(b) by 198 days.

(21) Appl. No.: 13/033,857

(22) Filed: Feb. 24, 2011

(65) Prior Publication Data

US 2011/0210805 A1 Sep. 1, 2011

Related U.S. Application Data

(63) Continuation of application No. PCT/EP2009/060841, filed on Aug. 21, 2009.

(30) Foreign Application Priority Data

Sep. 1, 2008 (DE) .......................... 10 2008 045 346

(51) Int. Cl.
*H03H 9/70* (2006.01)
*H03H 9/72* (2006.01)
*H03H 9/54* (2006.01)
*H03H 9/60* (2006.01)
(Continued)

(52) U.S. Cl.
CPC .............. *H03H 9/706* (2013.01); *H01Q 1/50* (2013.01); *H03H 9/547* (2013.01); *H03H 9/605* (2013.01); *H03H 9/6409* (2013.01); *H03H 9/6483* (2013.01); *H03H 9/725* (2013.01)

(58) Field of Classification Search
CPC ....... H03H 7/463; H03H 9/703; H03H 9/706; H03H 9/72; H03H 9/725; H03H 2009/02496; H03H 2009/02511; H03H 9/54; H03H 9/547; H03H 9/56; H03H 9/64
USPC .......................... 333/175, 176, 187, 133, 193
See application file for complete search history.

(56) References Cited

U.S. PATENT DOCUMENTS

| 4,599,587 A | 7/1986 | Hartmann et al. |
| 4,910,481 A | 3/1990 | Sasaki et al. |
| 6,166,611 A | 12/2000 | Seki et al. |

(Continued)

FOREIGN PATENT DOCUMENTS

| DE | 10 2004 053 319 A1 | 5/2006 |
| DE | 10 2005 028 927 A1 | 12/2006 |

(Continued)

OTHER PUBLICATIONS

Hikita, M., et al., "1.5-GHz SAW Miniature Antenna Duplexer Used in Personal Digital Cellular," Special Issue on Microwave Devices for Mobile Communications, IEICE Transaction on Electronics, XP 000621609, May 1996, pp. 664-670, vol. E79-C, No. 5.

(Continued)

*Primary Examiner* — Dean Takaoka
*Assistant Examiner* — Alan Wong
(74) *Attorney, Agent, or Firm* — Slater & Matsil, L.L.P.

(57) ABSTRACT

A duplexer includes an antenna terminal, a transmission amplifier terminal and a reception amplifier terminal. The transmission amplifier terminal is coupled to the antenna terminal via a transmission filter. The reception amplifier terminal is coupled to a reception filter and the reception filter is coupled to the antenna terminal via a band-stop filter.

41 Claims, 5 Drawing Sheets

(51) Int. Cl.
*H03H 9/64* (2006.01)
*H01Q 1/50* (2006.01)

(56) References Cited

U.S. PATENT DOCUMENTS

| | | | |
|---|---|---|---|
| 6,262,637 B1 | 7/2001 | Bradley et al. | |
| 6,351,197 B1 | 2/2002 | Selmeier et al. | |
| 6,489,861 B2 | 12/2002 | Noguchi et al. | |
| 6,717,487 B2 * | 4/2004 | Takata | 333/133 |
| 6,879,224 B2 | 4/2005 | Frank | |
| 7,042,311 B1 | 5/2006 | Hilliker et al. | |
| 7,230,510 B2 | 6/2007 | Lobeek | |
| 7,324,493 B2 | 1/2008 | Yamada et al. | |
| 7,339,445 B2 | 3/2008 | Aigner et al. | |
| 7,365,619 B2 | 4/2008 | Aigner et al. | |
| 7,579,926 B2 * | 8/2009 | Jhung | 333/133 |
| 7,579,927 B2 | 8/2009 | Iwamoto et al. | |
| 7,583,936 B2 | 9/2009 | Kovacs et al. | |
| 7,649,304 B2 * | 1/2010 | Umeda et al. | 310/320 |
| 7,683,736 B2 | 3/2010 | Inoue et al. | |
| 7,688,161 B2 | 3/2010 | Miura et al. | |
| 7,733,197 B2 | 6/2010 | Itou | |
| 7,915,975 B2 | 3/2011 | Bauer et al. | |
| 8,063,717 B2 * | 11/2011 | Bradley et al. | 333/133 |
| 8,076,999 B2 * | 12/2011 | Schmidhammer | 333/187 |
| 2002/0140520 A1 | 10/2002 | Hikita et al. | |
| 2003/0062969 A1 | 4/2003 | Inoue | |
| 2003/0227357 A1 | 12/2003 | Metzger et al. | |
| 2005/0174192 A1 | 8/2005 | Kawamura | |
| 2006/0091977 A1 | 5/2006 | Inoue et al. | |
| 2006/0158281 A1 | 7/2006 | Garris et al. | |
| 2006/0229030 A1 | 10/2006 | Simon et al. | |
| 2006/0232362 A1 | 10/2006 | Frank | |
| 2007/0046394 A1 | 3/2007 | Inoue et al. | |
| 2007/0149146 A1 | 6/2007 | Hwang et al. | |
| 2007/0191055 A1 | 8/2007 | Kovacs et al. | |
| 2008/0116993 A1 | 5/2008 | Yamakawa et al. | |
| 2008/0136555 A1 | 6/2008 | Schmidhammer | |
| 2008/0180193 A1 | 7/2008 | Iwasaki et al. | |
| 2008/0197941 A1 | 8/2008 | Suzuki et al. | |
| 2008/0238567 A1 | 10/2008 | Rosetti et al. | |
| 2008/0258983 A1 | 10/2008 | Bauer et al. | |
| 2008/0258989 A1 | 10/2008 | Rao et al. | |
| 2009/0167459 A1 | 7/2009 | Jakob et al. | |
| 2011/0248795 A1 | 10/2011 | Beaudin et al. | |

FOREIGN PATENT DOCUMENTS

| | | |
|---|---|---|
| DE | 10 2005 043 373 A1 | 3/2007 |
| DE | 10 2005 051 852 A1 | 5/2007 |
| DE | 10 2006 005 298 A1 | 8/2007 |
| DE | 10 2009 011 639 A1 | 9/2010 |
| EP | 1 265 312 A2 | 12/2002 |
| EP | 1 798 807 A1 | 6/2007 |
| JP | 06-152299 A | 5/1994 |
| JP | 09-098046 A | 4/1997 |
| JP | 09-232909 A | 9/1997 |
| JP | 2000-059174 A | 2/2000 |
| JP | 2001-068965 A | 3/2001 |
| JP | 2001-313542 A | 11/2001 |
| JP | 2003-283363 A | 10/2003 |
| JP | 2004-104799 A | 4/2004 |
| JP | 2005-160056 A | 6/2005 |
| JP | 2006-061783 A | 3/2006 |
| JP | 2006-180192 A | 7/2006 |
| JP | 2007-036856 A | 2/2007 |
| JP | 2008-109413 A | 5/2008 |
| JP | 2008-160562 A | 7/2008 |
| WO | WO 2004/047290 A1 | 6/2004 |
| WO | 2004075402 A1 | 9/2004 |
| WO | WO 2004075402 A1 * | 9/2004 |
| WO | WO 2005/053172 | 6/2005 |
| WO | WO 2005/053172 A1 | 6/2005 |
| WO | WO 2006/040927 A1 | 4/2006 |
| WO | WO 2006/121551 A1 | 11/2006 |
| WO | WO 2006133807 A1 * | 12/2006 |
| WO | WO 2007119556 A1 * | 10/2007 |
| WO | WO 2008/067793 A1 | 6/2008 |

OTHER PUBLICATIONS

Beaudin, S., et al., "A New SAW Band Reject Filter and its Applications in Wireless Systems," 2002 IEEE Ultrasonics Symposium, XP001204393, 2002, pp. 147-151.

Jian, C.-Y., et al., "SAW Band Reject Filter Performance at 850 MHz," 2005 IEEE Ultrasonic Symposium, 2005, pp. 2162-2165.

Hikita, M., et al., "1.5-GHz SAW Miniature Antenna Duplexer Used in Personal Digital Cellular," IEICE Transactions on Electronics, vol. E79-C, No. 5, May 1996, pp. 664-670.

Beaudin, S., et al., "A New SAW Band Reject Filter and its Applications in Wireless Systems," Proceedings of the IEEE Ultrasonics Symposium, vol. 1, Oct. 8-11, 2002, pp. 147-151.

Jian, C-Y., et al., "SAW Band Reject Filter Performance at 850 MHz," Proceedings of the IEEE Ultrasonics Symposium, vol. 4, Sep. 18-21, 2005, pp. 2162-2165.

Maxim Integrated Products, "Impedance Matching and the Smith Chart: The Fundamentals," Tutorial 742, Maxim Integrated Products, Inc., Jul. 2002, 20 pages.

* cited by examiner

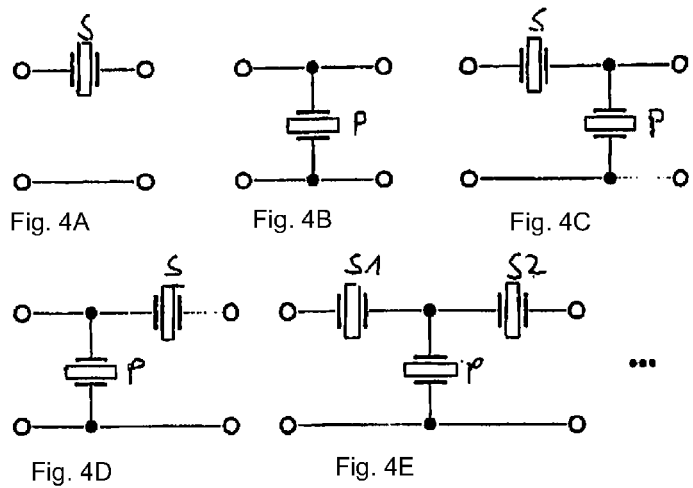
Fig. 4A  Fig. 4B  Fig. 4C
Fig. 4D  Fig. 4E
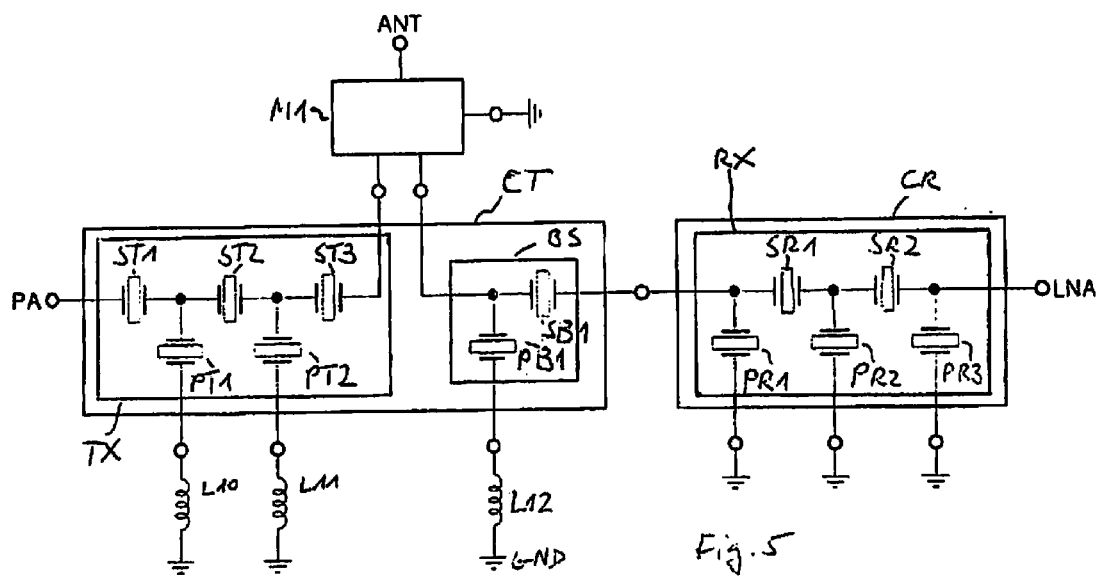
Fig. 5
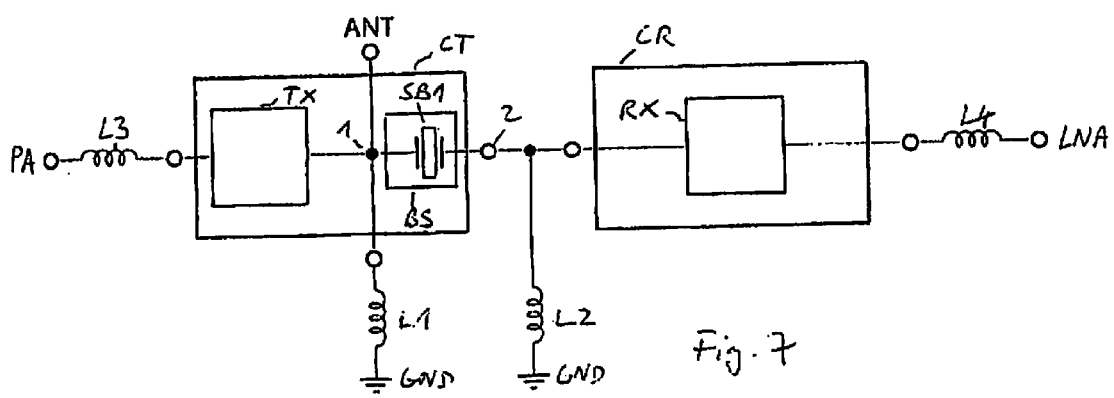
Fig. 7

DUPLEXER AND METHOD FOR INCREASING THE ISOLATION BETWEEN TWO FILTERS

This application is a continuation of co-pending International Application No. PCT/EP2009/060841, filed Aug. 21, 2009, which designated the United States and was not published in English, and which claims priority to German Application No. 10 2008 045 346.3, filed Sep. 1, 2008, both of which applications are incorporated herein by reference.

BACKGROUND

The invention relates to a duplexer in which, in the transmission path, a transmission signal is led from a transmission amplifier to the antenna and, in the reception path, a reception signal is led from the antenna to a reception amplifier. In order to be able to transmit and receive simultaneously, different frequency ranges are used for the transmission signal and the reception signal. In order that the transmission signal does not interfere with the very much weaker reception signal, a reception filter is provided in the reception path, which reception filter passes the reception signal and greatly suppresses the transmission signal. An isolation of 50 dB to 60 dB between the reception path and the transmission path is typically required in the transmission frequency band.

In the case of closely adjacent transmission and reception frequency ranges, the isolation in the transmission frequency range is determined by the selection of the reception filter, which is usually embodied as a bandpass filter. If the reception frequency range lies above the transmission frequency range, the selection is predetermined by the gradient of the lower reception filter edges. With a predetermined reception filter bandwidth and the required impedance matching, however, the selection cannot be increased arbitrarily owing to the dictates of design. With the aid of inductances, an improvement in the isolation of approximately 10 dB can be achieved by means of a pole shift. However, this method can be used only to a limited extent in the case of duplexers having a small separation between the transmission and reception frequency bands of only approximately 20 MHz and at transmission and reception frequencies of approximately 1.9 GHz, since the lower reception filter edge is flattened. Furthermore, the inductance values have fluctuations that reduce the transmission range isolation specified as typical.

SUMMARY

In one aspect the invention increases the isolation between the transmission and reception paths at transmission frequencies.

In one embodiment the invention provides a duplexer comprising an antenna terminal, a transmission amplifier terminal and a reception amplifier terminal. The transmission amplifier terminal is coupled to the antenna terminal via a transmission filter and the reception amplifier terminal is coupled to a reception filter. The reception filter is coupled to the antenna terminal via a band-stop filter. The band-stop filter separates the transmission path from the reception path, such that the isolation of the duplexer is increased.

The transmission filter has a passband, while the band-stop filter has a stop band in the passband of the transmission filter. Since the stop band of the band-stop filter lies in the passband of the transmission filter, the isolation in the transmission frequency range is increased.

The transmission filter comprises at least one resonator and the band-stop filter comprises at least one same resonator as the transmission filter. In the application, the term "same resonators" is taken to mean resonators which have the same resonant frequencies and the same layer construction with regard to materials and layer thicknesses. However, they can have different areas and thus have different static capacitances. Since the band-stop filter and the transmission filter have the same resonator, the design outlay and the manufacture of the duplexer can be simplified.

In one development, the transmission filter and the band-stop filter comprise ladder structures having series resonators or parallel resonators. The desired transfer properties of the transmission filter and of the band-stop filter can be synthesized with the aid of cascaded ladder structures.

In one development, at least one parallel resonator of the transmission filter has a resonant frequency that is lower than the resonant frequencies of the series resonators. The bandwidth of the transmission filter and of the band-stop filter can be set by means of the different resonant frequencies.

In one development, at least one series resonator of the band-stop filter is the same resonator as a parallel resonator of the transmission filter. The same manufacturing process used for the parallel resonator of the transmission filter can therefore also be used for the series resonator of the band-stop filter. Furthermore, the antiresonance of the parallel resonator then lies in series with the reception filter and increases the isolation.

In one development, at least one parallel resonator of the band-stop filter is the same resonator as a series resonator of the transmission filter. In this case, too, both the parallel resonator of the band-stop filter and the series resonator of the transmission filter can be realized in one process. By virtue of the parallel resonator and the series resonator of the transmission filter being used as a series resonator and parallel resonator, respectively, of the band-stop filter, the band-stop filter acquires a transfer function that is quasi inverse with respect to the passband of the transmission filter.

In one development, the resonant frequency of at least one series resonator of the band-stop filter differs from the resonant frequencies of the remaining series resonators of the band-stop filter.

In one development, the resonant frequency of at least one parallel resonator of the band-stop filter differs from the resonant frequencies of the remaining parallel resonators of the band-stop filter. The different resonant frequencies of the parallel and series resonators result in additional degrees of freedom being available which can be used to optimize the duplexer with regard to the matching and the transfer function and the isolation.

In one development, the resonators whose resonant frequencies differ from the other resonators have an additional mass coating which changes the resonant frequency and which is not present, or not present to the same extent, in the other resonators. If the additional mass coating can be applied using simple means, then it constitutes one possibility of influencing the resonant frequency without great outlay and without complicated process steps.

In one development, the additional mass coating is a titanium layer, an aluminum layer, a molybdenum layer, an iridium layer, a ruthenium layer, a silicon nitride layer, an aluminum nitride layer, a zinc oxide layer, a lead zirconate titanate (PZT) layer, a barium strontium titanate (BST) layer, or a layer composed of some other material, which layer is applied above or below a piezo-layer of the resonator, or thickens the piezo-layer. These layers can be applied in a targeted manner, or can be removed by simple process steps, such that it is possible to change the resonant frequency without great outlay.

In one development, the resonators of the transmission filter and the resonators of the band-stop filter are BAW resonators and are arranged on the same substrate. The resonators of the transmission filter and of the band-stop filter can, if they are the same in accordance with the above definition, be manufactured by means of the same process, as a result of which the number of process steps is reduced.

In one development, the resonators of the reception filter and the resonators of the band-stop filter are BAW (Bulk Acoustic Wave) resonators and are arranged on the same substrate.

In one development, the resonators of the transmission filter, the resonators of the reception filter, and the resonators of the band-stop filter are BAW resonators and are arranged on the same substrate.

In one development, the reception filter comprises at least one SAW (Surface Acoustic Wave) resonator. SAW resonators permit balanced-unbalanced driving of the filters. SAW technology makes it possible to realize greatly different frequencies on one substrate.

In one development, the transmission filter and the band-stop filter comprise SAW resonators instead of BAW resonators, and the SAW resonators of the reception filter, of the transmission filter and of the band-stop filter are constructed on a common substrate.

SAW resonators having different resonant frequencies can be manufactured together by means of the same process, as a result of which the production of the duplexer is simplified.

In one development, GBAW resonators are used instead of BAW resonators. GBAW (Guided Bulk Acoustic Waves) are SAW-like components in which the acoustic wave runs just below the component surface. The resonant frequency of a GBAW resonator results firstly from the period of the finger arrangement as in the case of the SAW resonator and secondly from the layer construction as in the case of the BAW resonator. Therefore, the methods for frequency reduction in the case of BAW resonators can also be applied to GBAW resonators.

It is also possible for a duplexer to comprise both BAW and GBAW resonators and thus to be embodied as a hybrid duplexer.

The reception filter can comprise at least one GBAW resonator. Likewise, the transmission filter and the band-stop filter can comprise GBAW resonators instead of BAW resonators, wherein all the GBAW resonators of the reception filter, of the transmission filter and of the band-stop filter can be constructed on a common substrate.

In one development, at least one of the resonators of the band-stop filter has a first resonant frequency and a first static capacitance. It comprises a number N of resonators, wherein the number N is greater than or equal to two, the N resonators each have a static capacitance that is N times greater than the first static capacitance, the N resonators are connected in series with one another, and the resonant frequency deviates from the first resonant frequency by up to 3% at least in one of the N resonators. The multiplication of the resonator results in further degrees of freedom for the filter design by virtue of multiple poles being generated by the frequency deviation.

In one development, at least one of the resonators of the band-stop filter has a first resonant frequency and a first static capacitance. It comprises a number N of resonators, wherein the number N is greater than or equal to two, the N resonators each have a static capacitance that is N times less than the first static capacitance, the N resonators are connected in parallel with one another, and the resonant frequency deviates from the first resonant frequency by up to 3% at least in one of the N resonators. The multiplication of the resonator results in further degrees of freedom for the filter design by virtue of multiple poles being generated by the frequency deviation.

In one development, the duplexer further comprises at least one matching circuit designed such that upon reception of a reception signal the transmission filter constitutes an open circuit from the point of view of the reception filter, and reflections between the reception filter and the antenna terminal are minimized, and upon transmission of a transmission signal the reception filter constitutes an open circuit from the point of view of the transmission filter, and reflections between the transmission filter and the antenna terminal are minimized. The transmission filter, the reception filter and the band-stop filter have to be matched to one another and to the antenna terminal, such that power can be transferred with low losses and with the necessary isolation between the terminals.

In one development, the band-stop filter has a first terminal and a second terminal, wherein the first terminal is connected to the antenna terminal and the transmission filter and the second terminal is connected to the reception filter. The matching circuit comprises a first inductance and a second inductance, wherein the first inductance connects the first terminal to ground and the second inductance connects the second terminal to ground. The first inductance enables the matching of the transmission filter, while the first inductance together with the second inductance and the static capacitance of the band-stop filter forms a PI matching network for the reception filter.

In one development, the band-stop filter comprises a first series resonator, which is connected to the first terminal. By means of the first series resonator, the transfer properties with respect to the reception filter can be influenced in a targeted manner.

In one development, the first series resonator has an antiresonance lying in the passband of the transmission filter. At the antiresonance, the first series resonator has a high impedance, such that a high isolation with respect to the reception filter arises at frequencies in the passband of the transmission filter.

In one development, the band-stop filter further comprises at least one parallel resonator, wherein a first terminal of the at least one parallel resonator is connected to ground, and the other terminal of the at least one parallel resonator is connected to the second terminal and the first series resonator. The bandwidth of the band-stop filter can be set by means of the parallel resonator.

In one development, at least one of the first terminals of the at least one parallel resonator is connected to ground not directly but rather via an inductance, or a capacitance, or a combination of an inductance and a capacitance. The additional inductances enable further degrees of freedom in the matching of the duplexer.

In one development, the first series resonator has an antiresonance in the region of the lower passband edge of the transmission filter and the parallel resonator has a resonant frequency lying in the region of the center of the passband of the transmission filter. Since the antiresonance lies in the region of the lower passband edge of the transmission filter, the resonant frequency of the series resonator lies below the lower transmission filter passband edge and does not adversely affect the latter. The resonance of the parallel resonator in the region of the center of the passband of the transmission filter ensures that transmission frequencies are dissipated to ground and thus increase the isolation.

In one development, the first series resonator is the same as a parallel resonator of the transmission filter, but has an additional mass coating which reduces the resonant frequency of the first series resonator relative to the resonant frequency of the parallel resonator, and the parallel resonator connected to the second terminal is the same as a series resonator of the transmission filter. Since, in the production of resonators using BAW technology, usually only two resonant frequencies are available on one chip, the use of the same resonators both for the band-stop filter and for the transmission filter is advantageous. The reduction of the resonant frequency by means of an additional mass coating results in further degrees of freedom in the design. The mass coating can be embodied in the manner already mentioned further above.

In one development, the band-stop filter comprises a first terminal and a second terminal, and two series resonators connected in series via a connecting node. One of the series is connected to the first terminal and the other is connected to the second terminal. The first terminal is connected to the transmission filter and the second terminal is connected to the reception filter. The matching circuit comprises a first inductance and a second inductance, wherein the first inductance connects the first terminal to the antenna terminal and the second inductance connects the connecting node to ground. The first inductance supplies the necessary inductive character at the antenna terminal, while the second inductance together with the capacitances of the series resonators forms a T-network for the matching of the reception filter.

In one development, the first terminal is not connected to the transmission filter, but rather to the antenna terminal, and the first inductance is not connected to the antenna terminal, but rather to the transmission filter. In this way it is possible to configure the matching of the transmission filter independently of the matching of the reception filter.

In one development, the series resonator connected to the first terminal has an antiresonance in the region of the lower passband of the transmission filter, and the series resonator connected to the second terminal has an antiresonance frequency lying in the region of the center of the passband of the transmission filter. The combination of the antiresonances leads to a further increase in the isolation between the transmission and reception filters.

In one development, the series resonator connected to the first terminal is the same as a parallel resonator of the transmission filter, but has an additional mass coating which reduces the resonant frequency of the series resonator relative to the resonant frequency of the parallel resonator, and the series resonator connected to the second terminal is the same as a parallel resonator without additional mass coating of the transmission filter. The reduction of the resonant frequency has the effect that the latter is no longer directly at the lower transmission filter passband side, as a result of which the latter is not adversely affected. The use of the same resonators for the band-stop filter and the transmission filter makes it possible to produce these by means of the same process steps.

In one development, the first series resonator has an antiresonance but has no resonance. For isolation purposes it suffices if the first series resonator has a very high impedance at the antiresonance frequency.

In one development, at least one parallel resonator has a resonance but has no antiresonance. By means of the resonance, the resonators conduct well. For isolation purposes it suffices if a parallel resonator has a low impedance at the resonance.

In one development, the transmission filter comprises a series resonator via which it is connected to the first terminal. By virtue of the series resonator, the transmission filter at the antenna port in the reception frequency range behaves like an open circuit if it has an antiresonance in this frequency range.

In one development, the matching circuit further comprises an inductance which connects the transmission filter to the transmission amplifier terminal, and comprises an inductance which connects the reception filter to the reception amplifier terminal. The inductances serve for matching the transmission filter and the reception filter to the respective terminals.

In one development, further terminals are provided, which are coupled to the antenna terminal via respective filters and band-stop filters, wherein the stop bands of the respective band-stop filters lie in the passband of the transmission filter. The band-stop filters make it possible to achieve a high isolation between a plurality of signal paths. In addition, it is possible to minimize capacitive losses that arise if the separation between the passbands from one filter to the other is sufficiently large and one filter thus acts as capacitive loading on the other filter.

The invention furthermore provides a method for increasing the isolation between a first bandpass filter and at least one second bandpass filter, wherein the first bandpass filter and the at least one second bandpass filter are coupled to a common node. The at least one second band pass filter is coupled to the common node via a respective band-stop filter, wherein the respective band-stop filters effect suppression in a passband of the first bandpass filter. One advantage of this method is that the capacitive loading of the respective second filter by the band-stop filter is greatly reduced. This property is advantageous particularly in the case of filters in greatly different frequency ranges.

In one development, the filter function of the first bandpass filter and that of the band-stop filters are realized in each case by at least one same resonator.

In one development, the resonators of the first bandpass filter and the resonators of the at least one band-stop filter are realized on the same substrate.

In one development, the same resonators are realized by means of the same process steps.

In one development, the resonant frequency of at least one resonator of the band-stop filters is lowered relative to the resonant frequency of the same resonator of the first bandpass filter.

In one development, the resonant frequency is lowered by an additional mass coating applied on the resonator.

In one development, the resonators of the band-stop filters and of the first bandpass filter are BAW resonators.

In one development, the resonators of the band-stop filters are SAW resonators.

In one development, the resonators of the band-stop filters are GBAW resonators.

In one development, the first bandpass filter, the at least one second bandpass filter and an antenna coupled to the common node are impedance-matched to one another such that at frequencies lying in the passband of the first bandpass filter, the reflection of power between the first bandpass filter and the antenna is minimized, and the at least one second bandpass filter constitutes an open circuit from the point of view of the first bandpass filter, and at frequencies lying in each case in the passbands of the at least one second bandpass filter, the reflection of power between each second bandpass filter and the antenna is minimized, and the first bandpass filter constitutes an open circuit in each case from the point of view of the respective second bandpass filter.

In one development, the static capacitance of at least one resonator of the band-stop filters is varied for the matching.

In one development, at least one of the resonators of the band-stop filters has a first resonant frequency and a first static capacitance and is realized by at least a number N of resonators, wherein the number N of resonators is greater than or equal to two, the N resonators each have a static capacitance that is N times greater than the first static capacitance, the N resonators are connected in series with one another, and the resonant frequency deviates from the first resonant frequency by up to 3% at least in one of the resonators.

In one development, at least one of the resonators of the band-stop filters has a first resonant frequency and a first static capacitance and is realized by at least a number N of resonators, wherein the number N of resonators is greater than or equal to two, the N resonators each have a static capacitance that is N times less than the first static capacitance, the N resonators are connected in parallel with one another, and the resonant frequency deviates from the first resonant frequency by up to 3% at least in one of the resonators.

In one development, the resonators of the band-stop filters are SAW resonators.

BRIEF DESCRIPTION OF THE DRAWINGS

The invention is described below on the basis of exemplary embodiments with the aid of the figures, in which:

FIGS. 4A-4E, collectively FIG. 4, show exemplary embodiments of ladder structures with series resonators and parallel resonators;

FIG. 5 shows exemplary embodiments of a transmission filter, of a band-stop filter and of a reception filter;

FIG. 6, show exemplary embodiments in which resonators comprise a plurality of resonators;

FIGS. 7 to 10 show exemplary embodiments of a band-stop filter with a matching circuit;

The following list of reference symbols may be used in conjunction with the drawings:

1, 2 Terminals
fp Resonant frequency of the parallel resonator
fs Resonant frequency of the series resonator
A Connecting node
ANT Antenna terminal
BS Band-stop filter
C0 Static capacitance of the BAW resonator
CT Substrate of the transmission filter
CS Substrate of the reception filter
D Duplexer
GND Ground
I Isolation without band-stop filter
IB Isolation with band-stop filter
K Common node
L1, L2, L3, L4 Inductances
LNA, LNA1, LNA2 Reception amplifier terminals
M1, M2 Matching circuits
N Number of resonators
PA, PA1, PA2 Transmission amplifier terminals
P, P1, P2 Parallel resonator
PB1 Parallel resonator of the band-stop filter
PT1, PT2 Parallel resonator of the transmission filter
PR1, PR2, PR3 Parallel resonator of the reception filter
R Transfer function of reception filter
RB Transfer function of reception filter with band-stop filter
RX, RX1, RX2 Reception filter, second bandpass filters
T Transfer function of transmission filter
TP Passband of the transmission filter
TX, TX1 Transmission filter, first bandpass filter
TX2, TX3 Second bandpass filters
S, S1, S2 Series resonator
SB1, SB2 Series resonator of the band-stop filter
ST1, ST2, ST3 Series resonator of the transmission filter
SR1, SR2 Series resonator of the reception filter

DETAILED DESCRIPTION OF ILLUSTRATIVE EMBODIMENTS

Figure 1:
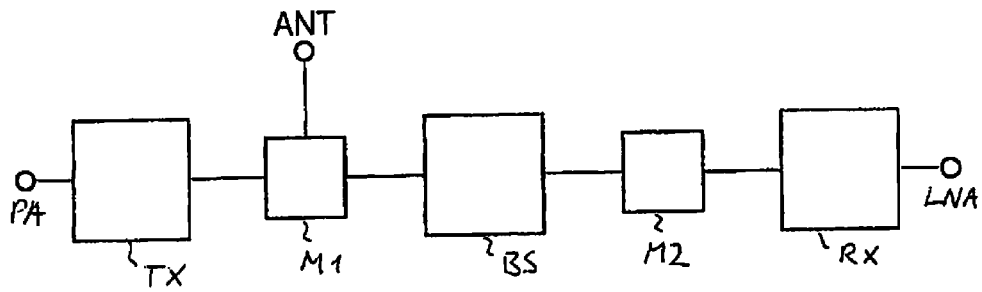
FIG. 1 shows an exemplary embodiment of a duplexer.

FIG. 1 shows an exemplary embodiment of a duplexer D comprising a transmission amplifier terminal PA, a reception amplifier terminal LNA and an antenna terminal ANT. The transmission amplifier terminal PA is coupled to a transmission filter TX, and the reception amplifier terminal LNA is coupled to a reception filter RX. Two matching circuits M1 and M2 are provided, by means of which the transmission filter TX and the reception filter RX are impedance-matched to the antenna terminal ANT, such that no power is reflected when a transmission signal is transmitted to the antenna and when a reception signal is received by the antenna. The matching circuits M1 and M2 are designed such that the reception filter RX constitutes an open circuit from the point of view of the transmission filter TX at transmission frequencies and the transmission filter TX also constitutes an open circuit from the point of view of the reception filter RX at reception frequencies. The isolation between the transmission path and the reception path is increased by means of the band-stop filter BS situated in the reception signal path. Such a duplexer D can be used, e.g., during operation in WCDMA (Wideband Code Division Multiple Access) band II for the simultaneous transmission and reception of signals.

Figure 2:
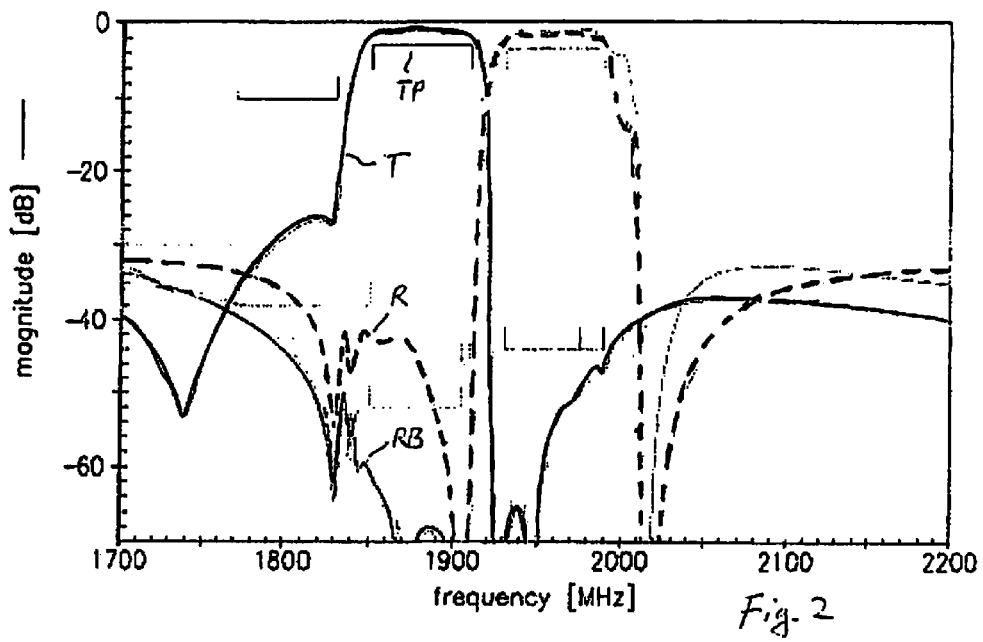
FIG. 2 shows exemplary transfer functions between an antenna terminal and a transmission amplifier terminal, and between an antenna terminal and a reception filter and respectively a reception filter with a band-stop filter.
Figure 3:
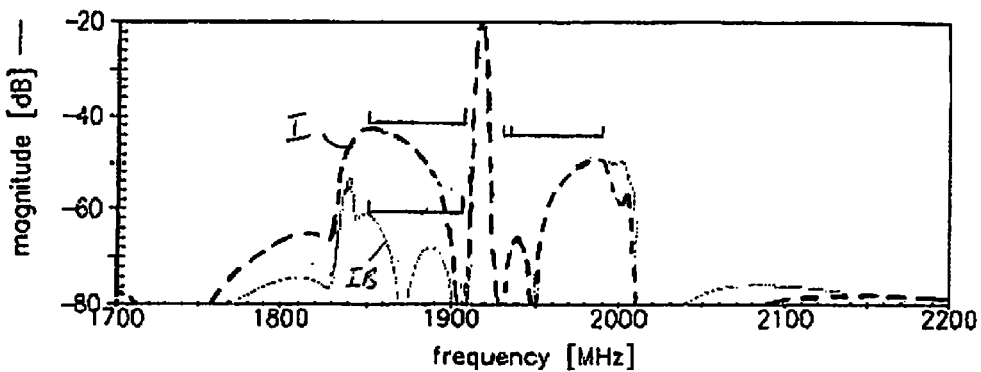
FIG. 3 shows exemplary isolation profiles between a transmission amplifier terminal and a reception amplifier terminal.
Figure 6A:
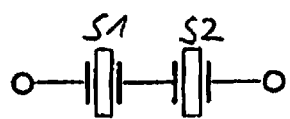
FIGS. 6A-6D, collectively
Figure 6B:
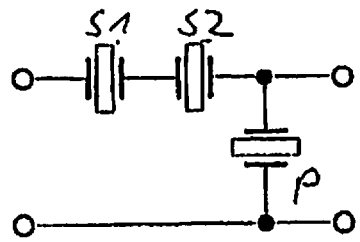
Figure 6C:
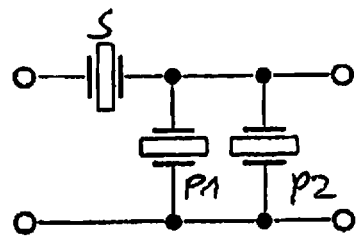
Figure 6D:
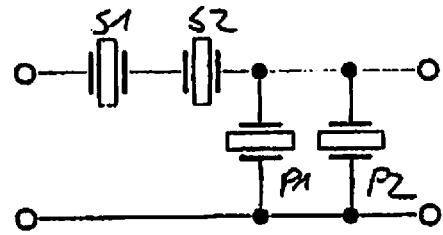

FIG. 2 and FIG. 3 show exemplary transfer functions, with and without a band-stop filter BS, between the antenna terminal ANT, the transmission amplifier terminal PA and the reception amplifier terminal LNA. The curve T in FIG. 2 shows the transfer function between the transmission amplifier terminal PA and the antenna terminal ANT. The curve RB shows the transfer function between the reception amplifier terminal LNA and the antenna terminal ANT. The curve R shows the transfer function between the reception amplifier terminal LNA and the antenna terminal ANT, but for comparison purposes without a band-stop filter BS. The transfer functions shown are already matched.

For WCDMA band II, the passband TP of the transmission signals lies between 1850 and 1910 MHz and has a width of 60 MHz. The reception band lies above the transmission band, the reception band likewise having a width of 60 MHz and lying between 1930 and 1990 MHz. Transmission and reception bands therefore have a separation from one another of just 20 MHz.

As shown by the comparison between the transfer functions R and RB, in the transmission frequency range a better suppression of transmission signals takes place by means of the band-stop filter BS than without a band-stop filter. Furthermore, the transfer functions R and RB lie virtually completely on top of each other in the reception frequency range, which shows that the band-stop filter BS only slightly influences the transfer function. It is furthermore important that the gradient of the left passband edge of the reception filter RX is maintained unchanged. The design of the band-stop filter BS is additionally independent of that of the transmission filter TX and of the reception filter RX. It therefore constitutes a new functional element which can be used to simplify the filter design by means of further degrees of freedom.

FIG. 3 shows the isolation between the transmission amplifier terminal PA and the reception amplifier terminal LNA. The curve I shows the isolation without a band-stop filter BS, while the curve IB shows the isolation with the band-stop filter BS. An improvement in the isolation from 40 dB to 60 dB is evident in the transmission frequency range.

FIGS. 4A to 4E show exemplary embodiments of ladder structures that can be used for the construction of the transmission filter TX, of the band-stop filter BS and of the reception filter RX. FIG. 4A shows a series resonator S, and FIG. 4B shows a parallel resonator P. FIGS. 4C and 4D show a combination of series resonators S and parallel resonators P. FIG. 4E shows a T-arrangement comprising two series resonators S1 and S2 and one parallel resonator P. The ladder structures can be interconnected with one another in a chain circuit in order to obtain multi-stage ladder structures. The number of stages and the selection of the ladder structures themselves are determined from the requirements made of the filter transconductance, filter bandwidth and insertion loss.

The ladder structures shown in FIG. 4 are "single ended-single ended". An extension for the "balanced-balanced" case occurs by mirroring the existing filter part at the ground rail and eliminating the access to the original ground node. Lattice structures are also possible for the "balanced-balanced" case.

The resonators of the ladder structures in FIG. 4 can be resonators which can be described by a Butterworth-van Dyke model. These are, e.g., resonators using bulk acoustic wave (BAW) technology, surface acoustic wave (SAW) technology, guided bulk acoustic wave (GBAW) technology, other microacoustic technologies, resonators composed of concentrated network elements such as inductances and capacitances or generally electromagnetically effective elements. These resonators exhibit a resonance, at which they conduct well, and an antiresonance, at which they conduct poorly. Beyond these resonances, the resonators typically exhibit capacitive behavior.

Resonators having only an antiresonance in each case are sufficient for the series resonators of the band-stop filter. A resonance is not necessary. One example thereof is a parallel resonant circuit composed of an inductance and a capacitance. Resonators having only a resonance in each case are sufficient for the parallel resonators of the band-stop filter. An antiresonance is not necessary. One example thereof is a tuning fork or a MEMS oscillator.

FIG. 5 shows exemplary embodiments of the transmission filter TX, the band-stop filter BS and the reception filter RX. In this case, the transmission filter TX consists of a chain circuit of two ladder structures in accordance with FIG. 4C and one ladder structure in accordance with FIG. 4A. It comprises the series resonators ST1, ST2, ST3 and the parallel resonators PT1, PT2. The band-stop filter BS is embodied in one stage and has the ladder structure shown in FIG. 4C. It comprises the series resonator SB1 and the parallel resonator PB1. The reception filter RX consists of a chain circuit of two ladder structures in accordance with FIG. 4D and one ladder structure in accordance with FIG. 4B. It comprises the series resonators SR1, SR2 and the parallel resonators PR1, PR2 and PR3. The inductance L12 shifts the resonant frequency of PB1. In addition, it is possible to provide matching elements at the terminals LNA and PA. If it is taken into account that the matching circuit M2 is not present, the arrangement corresponds to the duplexer D shown in FIG. 1.

In one exemplary embodiment, the parallel resonators and series resonators are bulk acoustic wave (BAW) resonators. Precisely at relatively high frequencies of approximately 2 GHz, BAW resonators have better electrical properties given the same dimensions by comparison with surface acoustic wave (SAW) resonators. They substantially consist of a piezoelectric layer that is arranged between two electrodes and together oscillate at a resonant frequency. In the case of BAW resonators, the frequency of the antiresonance lies above the frequency of the resonance. Alternatively, the resonators can also be GBAW resonators.

The parallel resonators have a lower resonant frequency than the series resonators. Since they lie in the passband path, the series resonators, by virtue of their antiresonance, form the upper edge of the passband of the transmission filter and of the reception filter, while the parallel resonators dissipate to ground and, by virtue of their resonance, form the lower edge. The bandwidth can be set by means of the differences in the frequencies.

In the case of BAW manufacturing technology, only two resonances fs and fp are usually available on one chip. More than two resonant frequencies are possible, but at the cost of higher process outlay and hence a lower component yield. Since the transmission filter TX and the reception filter RX have different center frequencies, they are therefore manufactured on dedicated substrates CT and CR.

In FIG. 5, the band-stop filter BS is integrated together with the transmission filter TX on the same substrate CT. The resonators of the band-stop filter BS are manufactured by means of the same manufacturing steps as the resonators of the transmission filter TX. The band-stop filter and the transmission filter therefore have the same resonators. In this way, no additional substrate is required for the band-stop filter BS and additional process steps are obviated.

In order to achieve a band-stop filter BS in the passband of the transmission filter TX with the same resonators, however, it is necessary to arrange the resonators differently: the parallel resonator PB1 of the band-stop filter BS is therefore the same resonator as the series resonators ST1, ST2 or ST3 of the transmission filter TX and dissipates to ground GND via the inductance L12 at the same resonant frequency. The series resonator SB1 of the band-stop filter BS is the same resonator as a parallel resonator PT1, PT2 of the transmission filter TX. By virtue of the fact that the same resonators are used for the band-stop filter BS and the transmission filter TX, some restrictions arise in the design of the duplexer, but, as described later, they can be circumvented.

While the band-stop filter BS in FIG. 5 is integrated together with the transmission filter TX on one substrate CT, thus resulting in considerable advantages during manufacture, the band-stop filter BS can also be manufactured by means of dedicated components externally or in a manner integrated in the housing.

The resonators SB1, PB1 of the band-stop filter BS could also be realized on the substrate CR of the reception filter RX. However, this necessitates a more complex BAW manufacturing process that makes it possible to be able to produce a third and, if appropriate, further resonator types having different resonant frequencies on one chip.

It is advantageous if in the arrangement, in contrast to the illustration in FIG. 5, the transmission filter begins with a series resonator, or a series resonator SR is arranged between the band-stop filter BS and the first parallel resonator PT1 of the transmission filter.

One essential advantage of the band-stop filter BS manufactured with BAW resonators compared with the use of external inductances which are arranged in the housing, in the duplexer module or on the circuit board is that the inductance values are subjected to great fluctuations relative to the frequency stability and manufacturing stability of the resonators. The transmission frequency isolation which can be specified as typical is therefore impaired unnecessarily. By contrast, the bandpass filter BS shown in FIG. 5 is constructed with acoustic components which, firstly, are frequency-trimmed and, secondly, are very thermally stable at approximately −20 ppm/K in the case of BAW resonators. The typical isolation can therefore be specified with smaller allowances, as a result of which requirements made of the manufacturing process can be reduced or the yield increases in the same manufacturing process.

The resonators of the reception filter RX can also be manufactured with SAW resonators instead of BAW resonators. SAW resonators have the advantage that they additionally afford a matching of "single ended" to "balanced" and possibly have better electrical properties. The combination of SAW technology and BAW technology forms a hybrid duplexer.

It is possible here to realize the transmission filter TX, the band-stop filter BS and the reception filter RX with SAW resonators. In this case, the SAW elements can be realized on a single substrate since, in the case of SAW manufacturing technology, resonators having different resonant frequencies are realized without relatively great outlay, e.g., by choosing suitable finger periods of the interdigital transducers (IDT).

Figure 12:
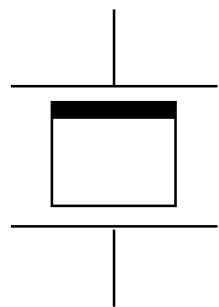
FIG. 12 shows diagram of a resonator with a mass coating.

In order to alter the resonant frequency of the resonators of the band-stop filter BS in order thus to optimize the electrical properties, there are a number of possibilities. In the case of a BAW resonator, additional mass coatings can be applied, which increase the oscillation mass of the resonator. One possibility consists in applying a material layer that can also be partly removed. The resonators with the mass coating then have a lower resonant frequency than those which have no additional material layer or in which the material layer is only partly present A schematic diagram of a resonator with a mass coating is provided is FIG. 12.

While the band-stop filter BS in FIG. 5 is integrated together with the transmission filter TX on one substrate CT, thus resulting in considerable advantages during manufacture, the band-stop filter BS can also be manufactured by means of dedicated components externally or in a manner integrated in the housing.

FIG. 6 shows exemplary embodiments in which a resonator comprises a plurality of resonators, thus giving rise to further degrees of freedom for the duplexer design. In comparison with FIGS. 4A and 4C, the series resonator S is replaced by the series resonators S1 and S2 in FIGS. 6A and 6B. FIG. 6C shows the replacement of the parallel resonator P from FIG. 4C by the parallel resonators P1 and P2. In comparison with FIG. 4C, the resonators S, P have been replaced by the series resonators S1, S2 and the parallel resonators P1 and P2 in FIG. 6D. In order that the replacing resonators have the same static capacitance C0 as the original resonators S, P, these must have double the capacitance, i.e., double the area, if they are connected in series and half the capacitance, i.e., half the area, if they are connected in parallel. In one of the resonators that are present doubly, the resonant frequency can be altered by up to 3% relative to the original resonators S, P, as described above. With the additional resonant frequency, further possibilities for optimization arise without the introduction of a new manufacturing process for BAW resonators with further resonant frequencies.

FIG. 7 shows an exemplary embodiment with a band-stop filter BS having a first terminal 1 and a second terminal 2, and with a matching network having a first inductance L1 and a second inductance L2. The band-stop filter BS consists of an individual series resonator SB1 and can again be manufactured together with the resonators of the transmission filter TX on the same substrate CT by means of the same process steps. L1 and L2 and the static capacitance of SB1 are designed such that upon reception of a reception signal the transmission filter TX constitutes an open circuit from the point of view of the reception filter RX and reflections between the reception filter RX and the antenna terminal ANT are minimized. Furthermore, upon transmission of a transmission signal the reception filter RX is intended to constitute an open circuit from the point of view of the transmission filter TX and reflections between the transmission filter TX and the antenna terminal ANT are intended to be minimized. In this case, the first inductance L1 serves for matching the transmission filter TX to the antenna terminal ANT. Together with the static capacitance C0 of the series resonator SB1 and with the second inductance L2, the first inductance L1 serves to form a PI network used for matching the reception filter RX. The matching circuit furthermore comprises the inductances L3 and L4. In this case, the inductances L3 and L4 serve for matching the transmission filter TX and the reception filter RX to the transmission amplifier terminal PA and the reception amplifier terminal LNA. In this case, the transmission filter TX and the reception filter RX can be configured in any desired manner. The matching can also be effected differently, e.g., by means of parallel inductances or a network having a predominantly inductive character.

The band-stop filter BS is intended to have a high-impedance behavior at transmission frequencies, i.e., to form an open circuit, as a result of which easier matching is possible. For this purpose, the first series resonator SB1 has an antiresonance frequency in the range of the passband TP of the transmission filter TX. Consequently, the reception filter RX always constitutes an open circuit from the point of view of the transmission filter TX. The use of a leading parallel resonator is not possible at this location since this would lead to a short circuit in the transmission frequency range. The series resonator SB1 can be a parallel resonator of the transmission filter TX, the resonant frequency of which is optionally lowered.

The resonance of the series resonator SB1 lies up to 3% below the transmission filter passband side in terms of frequency, such that no impairment of the left transmission filter edge occurs. This can be made possible by a lowering of the resonant frequency of the series resonator SB1 using the means mentioned above. Generally, it is not absolutely necessary in this case for the antiresonance to lie exactly in the center of the passband.

A further solution to this problem is the use of an inductance connected in series with the band-stop filter BS. In this way, the resonance of the band-stop filter BS, with the same antiresonance position, is pulled to lower frequencies and the left passband edge of the transmission filter TX remains unimpaired. At frequencies of approximately 2 GHz, however, the series inductance would have to be greater than 10 nH, as a result of which this solution is restricted to applications at higher frequencies.

Figure 8:
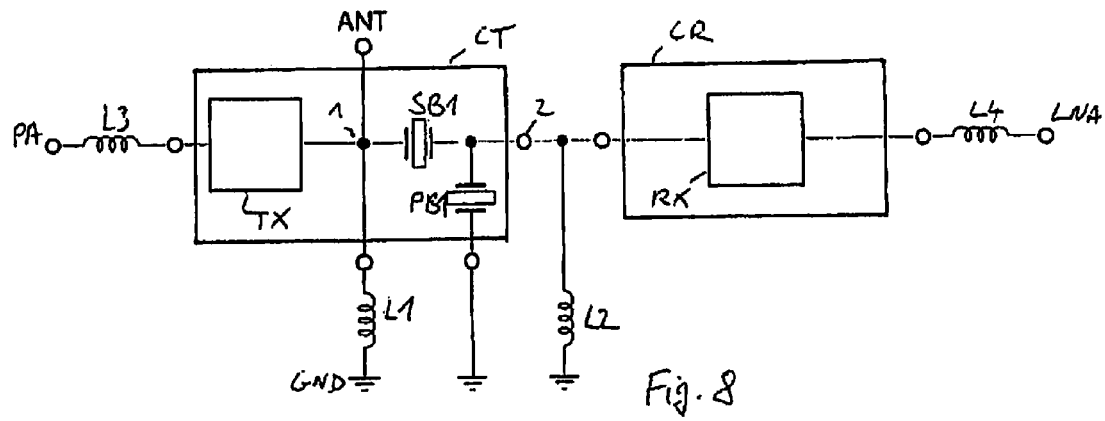

FIG. 8 shows an extension of FIG. 7 by a parallel resonator PB1, which is connected to the second terminal 2 and is connected by its first terminal to ground GND. The antiresonance of the first series resonator SB1 is again chosen such that it lies in the region of the lower passband filter edge. This can be effected, e.g., by means of a resonator using BAW technology, the frequency of the resonator being lowered by means of an additional mass coating. A series resonator of the transmission filter TX can be chosen for the parallel resonator PB1. The matching circuit is unchanged in its structure by comparison with FIG. 7. The inductance L2 can advantageously turn out to be smaller owing to the presence of the parallel resonator PB1. A leading SB1 resonator decouples the transmission filter TX from the reception filter RX, as a result of which the matching is simplified. The antiresonance lies in the passband of the transmission filter, or up to approximately 3% below, and the resonance lies below the passband, in order that the left passband edge is not impaired. Depending on the requirement made of the band-stop filter, even further parallel resonators can also be connected to the second terminal 2 and to ground GND. For the matching, the first terminals of the parallel resonators can be connected to ground GND at least in part also via inductances instead of a direct connection. The resonant frequencies of the further parallel resonators can differ from one another by up to 3%.

Figure 9:
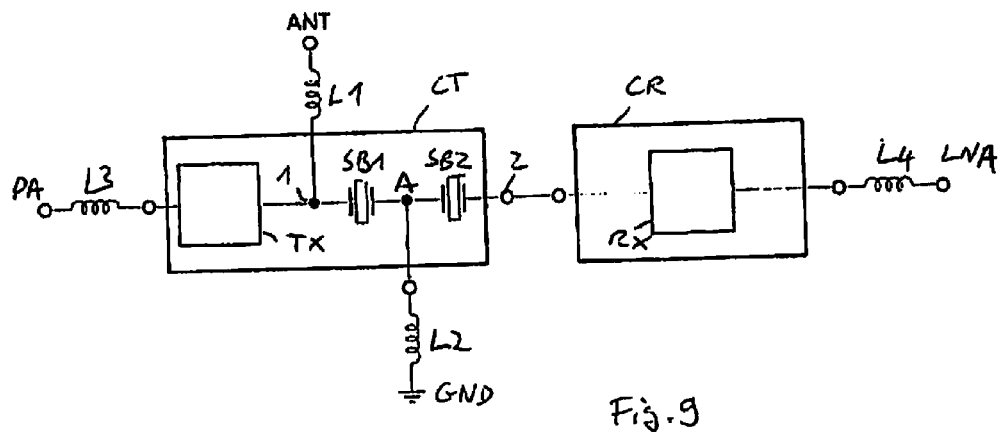

FIG. 9 shows a modification of FIG. 7, in which the series resonator SB1 has been replaced by two series resonators SB1 and SB2 connected in series. Instead of the matching circuit in FIG. 7, designed as a PI network, a T-network is used for matching the reception filter RX. The capacitances of the T-network are formed from the static capacitances of the series resonators SB1 and SB2. The inductance necessary for the T-network is supplied by the coil L2, which connects the connecting node A, via which the series resonators SB1 and SB2 are connected to one another, to ground GND. The series resonator SB1 again has the lowered resonant frequency of a parallel resonator of the transmission filter TX, such that its antiresonance lies at the lower bandpass edge of the transmission filter TX. The first inductance L1 supplies the predominantly inductive character at the antenna terminal ANT. The resonator SB2 is a parallel resonator of the transmission filter.

Figure 10:
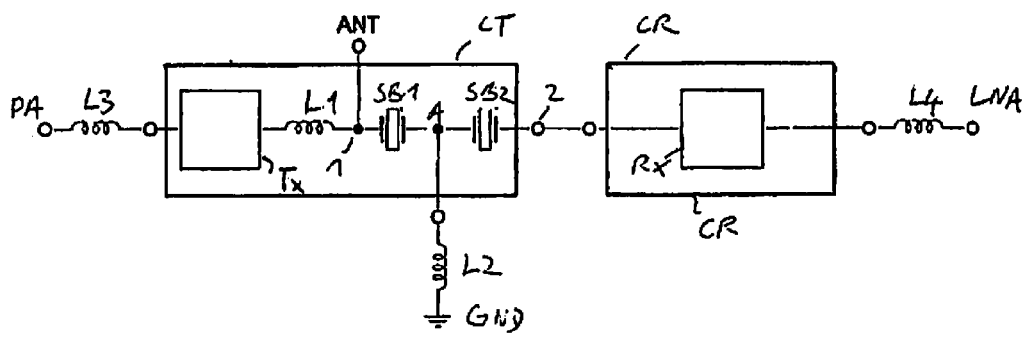

FIG. 10 shows a further exemplary embodiment, which is based on FIG. 9. In FIGS. 7 to 9, the matching of the transmission filter TX is not independent of the matching of the reception filter RX. This disadvantage can be avoided with the matching circuit shown in FIG. 10. By comparison with FIG. 9, the first inductance L1 no longer connects the first terminal 1 to the antenna terminal ANT, but rather to the transmission filter TX. However, the attainment of the open-circuit condition for the reception filter RX is more difficult with the arrangement shown. It is helpful if the transmission filter TX has a series resonator, such as, for example, the ST3 in FIG. 5, via which it is connected to the first inductance. The antenna terminal ANT is open-circuited in the reception frequency range.

Figure 11:
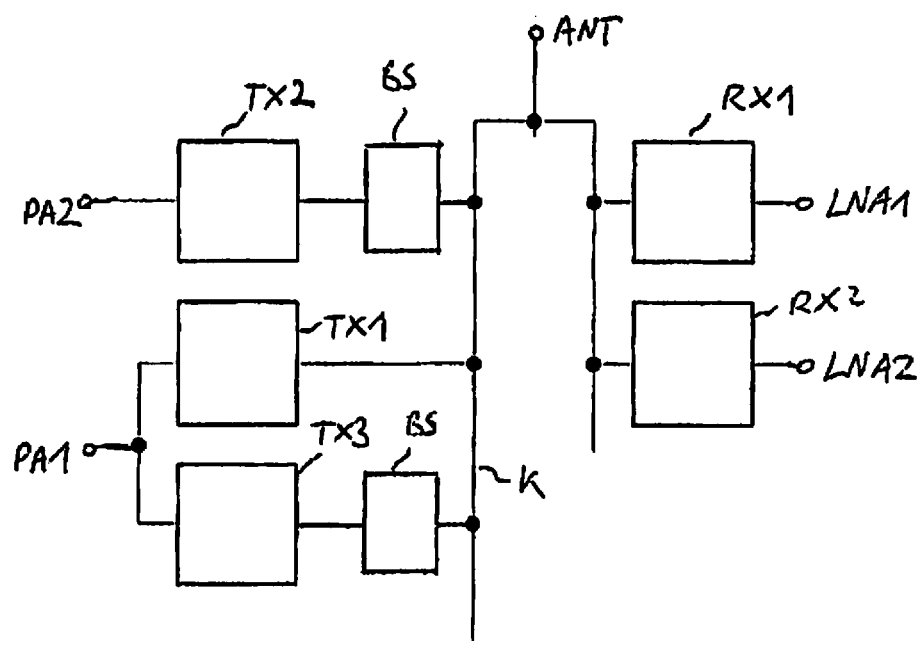
FIG. 11 shows an exemplary embodiment of a multiband duplexer with a plurality of band-stop filters and bandpass filters.

FIG. 11 shows an exemplary embodiment in which a plurality of filters TX1, TX2, TX3, RX1, RX2 are coupled to a common node K. Such an arrangement is present, e.g., in module applications in which a plurality of transmission and reception paths exist. A high isolation between each transmission path and each reception path, as already described above, is desired here. Furthermore, the intention is also to minimize capacitive losses that arise by virtue of the fact that bandpass filters having a sufficiently large band gap with respect to one another act on one another like a capacitive loading if they are connected to the common node K. The isolation between transmission and reception paths can be achieved in the manner described above. In order to reduce the insertion loss of the bandpass filter TX1 as a result of capacitive losses on account of the bandpass filters TX2 and TX3, a band-stop filter BS is connected upstream thereof. The band-stop filter BS can be a resonator whose antiresonance lies approximately in the bandpass center of the first bandpass filter TX1. The capacitive loading by the further bandpass filters RX1 and RX2 can also be eliminated in the same way. The matching circuits required are not shown in FIG. 11. All the abovementioned steps for the matching and selection of the resonators for the band-stop filter BS and also the variations described are also applicable to FIGS. 7 to 11.

What is claimed is:

1. A duplexer, comprising:
an antenna terminal;
a transmission amplifier terminal;
a reception amplifier terminal;
a transmission filter, wherein the transmission amplifier terminal is coupled to the antenna terminal via the transmission filter, wherein the transmission filter has a passband, and wherein the transmission filter comprises at least one resonator;
a reception filter coupled to the reception amplifier terminal;
a band-stop filter, wherein the reception filter is coupled to the antenna terminal via the band-stop filter, wherein the band-stop filter has a stop band in the passband of the transmission filter, and wherein the band-stop filter comprises at least one same resonator as the transmission filter, wherein a resonant frequency of at least one resonator of the band-stop filter has a lower frequency so as to be below the passband of the transmission filter;
wherein the transmission filter and the band-stop filter comprise ladder structures having series resonators or parallel resonators;
wherein at least one series resonator of the band-stop filter is the same resonator as a parallel resonator of the transmission filter;
wherein at least one parallel resonator of the band-stop filter is the same resonator as a series resonator of the transmission filter;
wherein a resonant frequency of at least one series resonator of the band-stop filter differs from resonant frequencies of the remaining series resonators of the band-stop filter or a resonant frequency of at least one parallel resonator of the band-stop filter differs from resonant frequencies of the remaining parallel resonators of the band-stop filter; and
wherein the resonators whose resonant frequencies differ from the other resonators have an additional mass coating that lowers the resonant frequency and which is not present, or not present to the same extent, in the other resonators; and
at least one matching circuit configured to provide an open circuit for the transmission filter from the point of view of the reception filter at reception frequencies and minimize
reflections between the reception filter and the antenna terminal, and
wherein the at least one matching circuit is configured to provide an open circuit for the reception filter at transmission frequencies from the point of view of the transmission filter, and minimize reflections between the transmission filter and the antenna terminal.

2. The duplexer according to claim 1, wherein the transmission filter has at least one parallel resonator and a plurality of series resonators and wherein at least one parallel resonator of the transmission filter has a resonant frequency that is lower than resonant frequencies of the series resonators of the transmission filter.

3. The duplexer according to claim 1, wherein a resonant frequency of at least one series resonator of the band-stop filter differs from resonant frequencies of the remaining series resonators of the band-stop filter.

4. The duplexer according to claim 1, wherein a resonant frequency of at least one parallel resonator of the band-stop filter differs from resonant frequencies of the remaining parallel resonators of the band-stop filter.

5. The duplexer according to claim 1, wherein
the additional mass coating comprises a passivation layer, a silicon dioxide layer, a tungsten layer, a titanium layer, an aluminum layer, a molybdenum layer, an iridium layer, a ruthenium layer, a silicon nitride layer, an aluminum nitride layer, a zinc oxide layer, a lead zirconate titanate layer or a barium strontium titanate layer, and
the layer is applied above or below a piezo-layer of the resonator, or thickens the piezo-layer.

6. The duplexer according to claim 1, wherein the resonators of the transmission filter and the resonators of the band-stop filter are BAW resonators and are arranged on the same substrate.

7. The duplexer according to claim 1, wherein the resonators of the reception filter and the resonators of the band-stop filter are BAW resonators and are arranged on the same substrate.

8. The duplexer according to claim 1, wherein the resonators of the transmission filter, the resonators of the reception filter and the resonators of the band-stop filter are BAW resonators and are arranged on the same substrate.

9. The duplexer according to claim 8, wherein the reception filter comprises at least one SAW resonator.

10. The duplexer according to claim 1, wherein
the resonators of the transmission filter and the resonators of the band-stop filter are SAW resonators and are arranged on the same substrate, and
wherein the SAW resonators of the reception filter, of the transmission filter and of the band-stop filter are constructed on a common substrate.

11. The duplexer according to claim 1, wherein the at least one resonator of the transmission filter comprises a GBAW resonator.

12. The duplexer according to claim 1, wherein at least one of the resonators of the band-stop filter has a first resonant frequency and a first static capacitance, and comprises at least a number N of resonators, wherein
the number N is greater than or equal to two,
the N resonators each have a static capacitance that is N times greater than the first static capacitance,
the N resonators are connected in series with one another, and
the resonant frequency deviates from the first resonant frequency by up to 3% at least in one of the N resonators.

13. The duplexer according to claim 1, wherein at least one of the resonators of the band-stop filter has a first resonant frequency and a first static capacitance, and comprises at least a number N of resonators, wherein
the number N is greater than or equal to two,
the N resonators each have a static capacitance that is N times less than the first static capacitance,
the N resonators are connected in parallel with one another, and
the resonant frequency deviates from the first resonant frequency by up to 3% at least in one of the N resonators.

14. The duplexer according to claim 1, wherein
the band-stop filter has a first terminal and a second terminal, wherein the first terminal is connected to the antenna terminal and the transmission filter and the second terminal is connected to the reception filter,
the matching circuit comprises a first inductance and a second inductance, wherein the first inductance connects the first terminal to ground and the second inductance connects the second terminal to ground.

15. The duplexer according to claim 14, wherein the band-stop filter comprises a first series resonator that is connected to the first terminal.

16. The duplexer according to claim 15, wherein the first series resonator has an antiresonance lying in the passband of the transmission filter or up to three percent below that in terms of frequency.

17. The duplexer according to claim 15, wherein the band-stop filter further comprises at least one parallel resonator, wherein a first terminal of the at least one parallel resonator is connected to ground, and the other terminal of the at least one parallel resonator is connected to the second terminal and the first series resonator.

18. The duplexer according to claim 17, wherein at least one of the first terminals of the at least one parallel resonator is connected to ground not directly but rather via an inductance, or a capacitance, or a combination of an inductance and a capacitance.

19. The duplexer according to claim 18, wherein the first series resonator has an antiresonance in the region of the lower passband edge of the transmission filter and the parallel resonator has a resonant frequency lying in the region of the center of the passband of the transmission filter.

20. The duplexer according to claim 15, wherein
the first series resonator is the same as a parallel resonator of the transmission filter, but has an additional mass coating that reduces the resonant frequency of the first series resonator relative to the resonant frequency of the parallel resonator, and
the parallel resonator connected to the second terminal is the same as a series resonator of the transmission filter.

21. The duplexer according to claim 15, wherein the first series resonator has an antiresonance but has no resonance.

22. The duplexer according to claim 15, wherein at least one parallel resonator has a resonance but has no antiresonance.

23. The duplexer according to claim 1, wherein
the band-stop filter comprises a first terminal and a second terminal, and two series resonators connected in series via a connecting node, of which one series resonators is connected to the first terminal and the other series resonator is connected to the second terminal,
the first terminal is connected to the transmission filter and the second terminal is connected to the reception filter, and
the matching circuit comprises a first inductance and a second inductance, wherein the first inductance connects the first terminal to the antenna terminal and the second inductance connects the connecting node to ground.

24. The duplexer according to claim 23, wherein
the series resonator connected to the first terminal has an antiresonance in the region of the lower passband of the transmission filter, and
the series resonator connected to the second terminal has an antiresonance frequency lying in the region of the center of the passband of the transmission filter.

25. The duplexer according to claim 23, wherein
the series resonator connected to the first terminal is the same as a parallel resonator of the transmission filter, but has an additional mass coating that reduces the resonant frequency of the series resonator relative to the resonant frequency of the parallel resonator, and
the series resonator connected to the second terminal is the same as a parallel resonator of the transmission filter.

26. The duplexer according to claim 25, wherein the transmission filter comprises a series resonator, the transmission filter being connected to the first terminal via the series resonator.

27. The duplexer according to claim 1, wherein
the band-stop filter comprises a first terminal and a second terminal, and two series resonators connected in series via a connecting node, of which one series resonators is connected to the first terminal and the other series resonator is connected to the second terminal,
the first terminal is connected to the antenna terminal, and
the first inductance does not connect the first terminal to the antenna terminal, but rather to the transmission filter,
the matching circuit comprises a first inductance and a second inductance, wherein the first inductance connects the first terminal to the transmission filter and the second inductance connects the connecting node to ground.

28. The duplexer according to claim 1, wherein the matching circuit further comprises:
an inductance that connects the transmission filter to the transmission amplifier terminal; and
an inductance that connects the reception filter to the reception amplifier terminal.

29. The duplexer according to claim 1, further comprising further terminals that are coupled to the antenna terminal via respective filters and band-stop filters, wherein the stop bands of the respective band-stop filters lie in the passband of the transmission filter.

30. A circuit comprising:
a first bandpass filter,
a band-stop filter; and
at least one second bandpass filter,
wherein the first bandpass filter and the at least one second bandpass filter are coupled to a common node,
wherein the at least one second bandpass filter is coupled to the common node via the band-stop filter, wherein the band-stop filter effects a suppression in a passband of the first bandpass filter, and
wherein a filter function of the first bandpass filter and a filter function of the band-stop filters are each realized by at least one same resonator;
wherein a resonant frequency of at least one resonator of the band-stop filter has a lower frequency so as to be below the passband of the first bandpass filter;
wherein the first bandpass filter and the band-stop filter comprise ladder structures having series resonators or parallel resonators;
wherein at least one series resonator of the band-stop filter is the same resonator as a parallel resonator of the first bandpass filter;
wherein at least one parallel resonator of the band-stop filter is the same resonator as a series resonator of the first bandpass filter;
wherein a resonant frequency of at least one series resonator of the band-stop filter differs from resonant frequencies of the remaining series resonators of the band-stop filter or a resonant frequency of at least one parallel resonator of the band-stop filter differs from resonant frequencies of the remaining parallel resonators of the band-stop filter; and
wherein the resonators whose resonant frequencies differ from the other resonators have an additional mass coating that lowers the resonant frequency and which is not present, or not present to the same extent, in the other resonators; and
at least one matching circuit configured to provide an open circuit for the first bandpass filter from the point of view of the at least one second bandpass filter at reception frequencies and minimize
reflections between the at least one second bandpass filter and the common node, and
wherein the at least one matching circuit is configured to provide
an open circuit for the at least one second bandpass filter at transmission frequencies from the point of view of the first bandpass filter, and minimize reflections between the first bandpass filter and the common node.

31. The circuit according to claim 30, wherein resonators of the first bandpass filter and resonators of the band-stop filter are realized on the same substrate.

32. The circuit according to claim 31, wherein the same resonators are realized by means of the same process steps.

33. The circuit according to claim 30, wherein the resonant frequency of at least one resonator of the band-stop filters is lowered relative to the resonant frequency of the same resonator of the first bandpass filter.

34. The circuit according to claim 30, wherein resonators of the band-stop filters and of the first bandpass filter are BAW resonators.

35. The circuit according to claim 30, wherein resonators of the band-stop filters are SAW resonators.

36. The circuit according to claim 30, wherein resonators of the band-stop filters are GBAW resonators.

37. The circuit according to claim 30, further comprising an antenna coupled to the common node wherein the first bandpass filter, the at least one second bandpass filter and the antenna are impedance-matched to one another such that at frequencies lying in the passband of the first bandpass filter, wherein the reflection of power between the first bandpass filter and the antenna is minimized, and
wherein the at least one second bandpass filter constitutes an open circuit from the point of view of the first bandpass filter, and at frequencies lying in each case in the passbands of the at least one second bandpass filter,
wherein the reflection of power between each second bandpass filter and the antenna is minimized, and
wherein the first bandpass filter constitutes an open circuit in each case from the point of view of the respective second bandpass filter.

38. The circuit according to claim 37, wherein a static capacitance of at least one resonator of the band-stop filters is varied for the matching.

39. The circuit according to claim 37, wherein at least one of the resonators of the band-stop filters has a first resonant frequency and a first static capacitance and is realized by at least a number N of resonators, wherein
the number N of resonators is greater than or equal to two,
the N resonators each have a static capacitance that is N times greater than the first static capacitance,
the N resonators are connected in series with one another, and
the resonant frequency deviates from the first resonant frequency by up to 3% at least in one of the resonators.

40. The circuit according to claim 37, wherein at least one of the resonators of the band-stop filters has a first resonant frequency and a first static capacitance and is realized by at least a number N of resonators, wherein
the number N of resonators is greater than or equal to two,
the N resonators each have a static capacitance that is N times less than the first static capacitance, the N resonators are connected in parallel with one another, and the resonant frequency deviates from the first resonant frequency by up to 3% at least in one of the resonators.

41. A duplexer, comprising:

an antenna terminal;

a transmission amplifier terminal;

a reception amplifier terminal;

a transmission filter, wherein the transmission amplifier terminal is coupled to the antenna terminal via the transmission filter, wherein the transmission filter has a passband, and wherein the transmission filter comprises at least one resonator;

a reception filter coupled to the reception amplifier terminal; and a band-stop filter, wherein the reception filter is coupled to the antenna terminal via the band-stop filter, wherein the band-stop filter has a stop band in the passband of the transmission filter, and wherein the band-stop filter comprises at least one same resonator as the transmission filter, wherein a resonant frequency of at least one resonator of the band-stop filter has a lower frequency so as to be below the passband of the transmission filter;

wherein the transmission filter and the band-stop filter comprise ladder structures having series resonators or parallel resonators;

wherein at least one series resonator of the band-stop filter is the same resonator as a parallel resonator of the transmission filter;

wherein at least one parallel resonator of the band-stop filter is the same resonator as a series resonator of the transmission filter;

wherein a resonant frequency of at least one series resonator of the band-stop filter differs from resonant frequencies of the remaining series resonators of the band-stop filter or a resonant frequency of at least one parallel resonator of the band-stop filter differs from resonant frequencies of the remaining parallel resonators of the band-stop filter;

wherein the resonators whose resonant frequencies differ from the other resonators have an additional mass coating that lowers the resonant frequency and which is not present, or not present to the same extent, in the other resonators;

wherein the resonators of the transmission filter and the resonators of the band stop filter are arranged on the same substrate; and at least one matching circuit configured to provide an open circuit for the transmission filter from the point of view of the reception filter at reception frequencies and minimize reflections between the reception filter and the antenna terminal, and wherein the at least one matching circuit is configured to provide an open circuit for the reception filter at transmission frequencies from the point of view of the transmission filter, and minimize reflections between the transmission filter and the antenna terminal.

* * * * *